(12) United States Patent
Ronda et al.

(10) Patent No.: US 8,779,448 B2
(45) Date of Patent: Jul. 15, 2014

(54) ILLUMINATION SYSTEM WITH LIGHT SOURCE, RADIATION CONVERTING ELEMENT AND FILTER

(75) Inventors: Cornelis Reinder Ronda, Aachen (DE); Oleg Borisovich Shchekin, San Francisco, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/993,086

(22) PCT Filed: Dec. 12, 2011

(86) PCT No.: PCT/IB2011/055608
§ 371 (c)(1),
(2), (4) Date: Sep. 13, 2013

(87) PCT Pub. No.: WO2012/080934
PCT Pub. Date: Jun. 21, 2012

(65) Prior Publication Data
US 2014/0008684 A1 Jan. 9, 2014

(30) Foreign Application Priority Data
Dec. 17, 2010 (EP) .................................... 10195727

(51) Int. Cl.
*H01L 33/00* (2010.01)
(52) U.S. Cl.
USPC .............................................. 257/89; 257/98
(58) Field of Classification Search
USPC .................................... 257/89, 98
See application file for complete search history.

(56) References Cited

U.S. PATENT DOCUMENTS

| | | | |
|---|---|---|---|
| 7,402,840 B2 | 7/2008 | Krames | |
| 7,495,375 B2 | 2/2009 | Huang | |
| 8,292,459 B2 * | 10/2012 | Mozer et al. | 362/235 |
| 2004/0119086 A1 | 6/2004 | Yano et al. | |
| 2004/0124430 A1 | 7/2004 | Yano et al. | |
| 2007/0241657 A1 | 10/2007 | Radkov et al. | |
| 2008/0170397 A1 | 7/2008 | Curran et al. | |
| 2012/0043678 A1 * | 2/2012 | Numata et al. | 264/1.36 |
| 2013/0169146 A1 * | 7/2013 | Aoki et al. | 313/498 |

FOREIGN PATENT DOCUMENTS

| | | |
|---|---|---|
| GB | 2406900 A | 4/2005 |
| WO | 2007039849 A1 | 4/2007 |

OTHER PUBLICATIONS

"Full down-conversion of amber-emitting phosphor-converted light-emitting diodes with powder phosphors and a long-wave pass filter", Jeong Rok Oh et al, Optics Express, 2010, v 18 (11), pp. 11063-11070.

"Lowering color temperature of Y3Al5O12:Ce3+ white light emitting diodes using reddish light-recycling filter", Jeong Rok Oh et al, Electrochemical and Solid-StateLetters, 2010, v 13 (1), pp. J5-J7.

\* cited by examiner

*Primary Examiner* — Ngan Ngo

(57) ABSTRACT

The invention relates to an illumination system comprising 1) a light source arranged to emit primary radiation, 2) a radiation converting element arranged to convert at least part of the primary radiation into secondary radiation, and 3) a filter arranged to block radiation generated in the illumination system having a wavelength shorter than a certain cut-off wavelength. According to the invention, the filter is designed to block a part of the secondary radiation by having arranged the cut-off wavelength of the filter in the emission spectrum of the radiation converting element. Illumination devices according to this design show emission spectra with small bandwidth.

7 Claims, 2 Drawing Sheets

ILLUMINATION SYSTEM WITH LIGHT SOURCE, RADIATION CONVERTING ELEMENT AND FILTER

FIELD OF THE INVENTION

The invention relates to an illumination system comprising a light source arranged to emit primary radiation, a radiation converting element arranged to convert at least part of the primary radiation into secondary radiation and a filter arranged to block radiation generated in the illumination system having a wavelength shorter than a certain cut-off wavelength.

BACKGROUND OF THE INVENTION

An illumination system of the type described in the opening paragraph is known as such. More specifically, such a system is disclosed in the granted patent U.S. Pat. No. 7,402,840 B2. This document teaches an illumination system having a semiconductor light emitting device (LED), a wavelength converting material and a filter material. The light emitting device is able to emit a first light with a first peak wavelength, which is absorbed by the wavelength converting material. This material (most often a luminescent material, such as an inorganic phosphor) is able to emit the absorbed first light as a second light with a second peak wavelength. The known illumination system further contains a filter, which is able to transmit the second light, but which reflects or absorbs a portion of the first light. With the known system, it is possible to produce light having high color purity. The use of the filter especially prevents that the first (or primary) light generated by the LED escapes from the system. Thus the only light emitted by the system is high color purity second (or secondary) light being emitted by the wavelength converting material.

Illumination systems of the described design often show the disadvantage that the bandwidth of their emission spectra is relatively large. There is a general need for illumination systems comprising one or more phosphor-based LEDs, which emit radiation of a relatively small spectrum band. This holds especially for systems that emit light in the red region of the electromagnetic spectrum, preferably in the region around 600-630 nm.

SUMMARY OF THE INVENTION

It is an object of the present invention to mitigate or at least diminish the drawback of the known illumination system. More particularly, the invention aims at providing an illumination system with phosphor-based LEDs, which shows a narrow emission band in a certain area of the electromagnetic spectrum, and especially in the red part of the spectrum (appr. 600-630 nm).

These and/or other objects are achieved according to the present invention with an illumination system comprising 1) a light source arranged to emit primary radiation, 2) a radiation converting element arranged to convert at least part of the primary radiation into secondary radiation, and 3) a filter arranged to block radiation generated in the illumination system having a wavelength shorter than a certain cut-off wavelength, wherein the filter is designed to block a part of the secondary radiation by having arranged the cut-off wavelength of the filter in the emission spectrum of the radiation converting element. The invention is inter alia based on the recognition of the inventors that by using a well-selected cut-off wavelength of the filter, two effects can be simultaneously achieved. First leak of primary light from the system can be prevented, as described in the above-mentioned patent document U.S. Pat. No. 7,402,840-B2. Secondly, by selecting the cut-off wavelength of the filter within the emission spectrum wavelength range of the radiation converting element, its emission spectrum can be made smaller or narrower, as is desired. No additional parts are needed to arrive at this combined effect. Therefore, the costs of the illumination system are essentially not increased by the measure according to the present invention. Preferred illumination systems are those in which the cut-off wavelength of the filter substantially coincides with the high energy part in the emission spectrum of the wavelength converting element.

Various state of the art phosphor systems can be used as wavelength converting element in the invented illumination system. The choice of luminescent materials such as phosphors or mixtures of phosphors will inter alia depend on the desired emission band wavelength maximum. A person skilled in the art can make the right choices based on the known details of the phosphor systems, irrespective whether they are applied in powder form, compounded in a resin material or as a sintered powder in a ceramic layer.

It is noted that other approaches to reduce the bandwidth of the emission spectra of wavelength converting elements were not or only partially successful. Line emitting phosphors with relatively narrow emission bands used in a first approach generally have too long decay times and too weak absorptions, which excludes them from practical use. Moreover, many $Eu^{2+}$-containing phosphors used in a second approach have rather broad emission bands or are unstable in (moist) air, which also limits their practical use.

An interesting embodiment of the illumination system according to the invention has the feature that the filter is an interference filter, which reflects blocked radiation back unto the radiation converting element. This measure improves the efficiency of the illumination system. When using an absorption filter, blocked radiation emitted either by the light source (primary radiation of substantially the whole emission spectrum) or by the radiation converting element (secondary radiation with wavelength shorter than the cut-off wavelength) is lost as heat due to its absorption in the filter. Using an interference filter has the advantage that the blocked primary and secondary radiation is reflected back unto the radiation converting element. Here the reflected radiation can be (re)absorbed, converted to radiation of a longer wavelength, and sent back to and through the interference filter. The part of the re-sent radiation having a wavelength longer than the cut-off wavelength of the interference filter can pass this filter. The (re)absorption and resending of the reflected radiation therefore results in a higher output efficiency of the illumination system.

Another interesting embodiment of the illumination system according to the invention has the feature that the interference filter is a band-pass reflective filter. Such filter reflects irradiation between two cut-off wavelengths. The low energy cut-off wavelength preferably should be arranged in the emission spectrum of the radiation converting element.

The high energy cut-off wavelength should preferably be arranged between the emission spectra of the radiation converting element and the emission spectrum of the primary light source. Illumination systems having such filter allow that also (part) of the primary radiation can be mixed with the secondary radiation and the mixed radiation be emitted from the illumination system.

A further interesting embodiment of the invented illumination system is characterized in that the absorption spectrum and the emission spectrum of the radiation converting element substantially overlap. It is noted that a 'substantial overlap' exists in case that the area of overlap is at least 5% of the total area covered by both the normalized emission spectrum and the normalized absorption spectrum. This measure can further enhance the efficiency of the invented system. This is due to the fact that the efficiency increase is resulting from re-absorption of emitted light reflected by the interference filter by the same phosphor material, followed by emission of this luminescent material. This process only occurs in case of spectral overlap. In this way, photon losses are minimized.

Another advantageous embodiment of the illumination system according to the invention is characterized in that the cut-off wavelength of the filter substantially coincides with the wavelength where the (normalized) absorption spectrum and the (normalized) emission spectrum of the radiation converting element cross. In practice this means that the cut-off wavelength differs less than 10 nm from the wavelength where the absorption spectrum and emission spectrum of the converting element cross. By selecting the cut-off wavelength according to this embodiment, an even further improvement of the light output efficiency can be obtained. This condition further optimizes the re-absorption of light with a relatively short wavelength and further reduces the band width of the resulting emission.

A further advantageous embodiment of the invented illumination system has the feature that the Stokes Shift of the radiation converting element is smaller than 0.20 eV. Under these circumstances, a significant overlap of normalized emission and absorption spectra is obtained. The Stokes shift of the radiation converting element is preferably smaller than 0.15 and more preferably between 0.07 and 0.12 eV. In case of a small Stokes shift (especially smaller than 0.07 eV), the band width is already rather small; this renders the invention less useful.

Interesting is also the embodiment of the illumination system according to the present invention in which the emission spectrum of the radiation converting element has a peak emission wavelength in the range of 585-625 nm. By a proper choice of the cut-off wavelength of the interference filter around 600 nm; an efficient illumination system can be obtained having a small bandwidth emission spectrum. Illumination systems of this type are especially advantageous, as the efficacy of LEDs with high color rendering is critically dependent on the width of the red emission band. The eye sensitivity rapidly decreases with increasing wavelength above 630 nm. On the other hand, red emission with considerable intensity in the electromagnetic spectrum area below 600 nm has a negative impact on the color rendering. Therefore required illumination systems have a small emission bandwidth and a peak wavelength in the range between 585-625, preferably in the range of 595-620 and more preferably in the range between 605-615 nm.

BRIEF DESCRIPTION OF THE DRAWINGS

These and other aspects of the invention will be apparent from and elucidated with reference to the embodiments described hereinafter.

In the drawings.

It is stressed that the drawing is schematic and not to scale. In the different Figures, same elements are denoted with the same reference numbers.

DETAILED DESCRIPTION OF EMBODIMENTS

Figure 1:
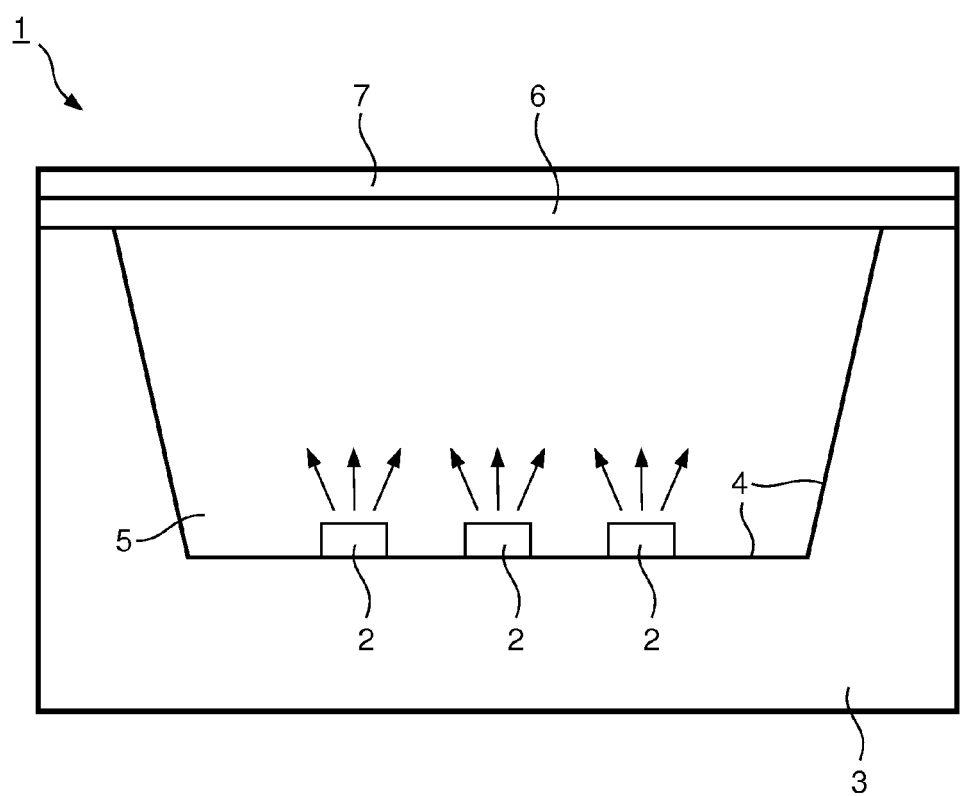
FIG. 1 shows in cross-section an embodiment of the illumination system according to the invention.

FIG. 1 illustrates in cross-section an embodiment of the illumination system 1 according to the present invention. Said system 1 comprises a number of light sources 2, which are embodied as a light emitting diodes (LEDs). Although different types of LEDs can be used, it is prefered to apply LEDs which are able to emit primary radiation having a wavelength of 550 nm or less. In the present device LEDs of the GaInN type are used, which are able to emit light having a wavelength maximum between 370-470 nm.

LEDs 2 are mounted on the bottom surface of a housing 3. On the inside walls of said housing 3, reflective means 4 have been provided, like a mirror of aluminum. During activation of the illumination system, an electrical voltage is applied via electrical leads on electrical connection portions of the LEDs. For reasons of simplicity, neither the electrical leads nor the electrical connection portions are shown. As a result of the activation, LEDs 2 emit radiation. This radiation is indicated by the small arrows that point away from LEDs 2 in cavity 5 of the housing.

The top part of housing 3 is provided with a layer 6 of state of the art luminescent material. In the described embodiment, said luminescent material is formed as a plate of sintered grains containing a phosphor material (Lumiramic). It is stressed that powder layers can be contemplated as well. Ceramic layer 6 acts as a radiation converting element, which is arranged to convert a part or all of the primary radiation into secondary radication. On the side of layer 6 that faces away from the light sources 2, a radiation blocking filter 7 is arranged which is able to reflect radiation generated in the illumination system having a wavelength shorter than a certain cut-off wavelength. Preferably said filter 7 is directly attached to layer 6. In the present embodiment, said filter 7 is a reflective filter comprising an optically transparent substrate on which a multilayer of e.g. $SiO_2/TiO_2$ with a required layer thickness profile and $SiO_2/TiO_2$ sequence is provided.

Primary radiation emitted by LEDs 2 is directed to the wavelength converting element embodied here as ceramic layer 6 of phosphor material. The absorption can also take place in higher excited states. The primary radiation absorbed (directly or indirectly) by layer 6 is converted into secondary radiation having a longer wavelength. Depending on the cut-off wavelength of reflective filter 7 all or part of this secondary radiation can pass filter 7, namely the part of the radiation having a wavelength longer than said cut-off wavelength. Essentially, depending on the steepness of the filter, most or all primary radiation and secondary radiation having a wavelength shorter than the cut-off wavelength of filter 7 will be reflected back into the radiation converting element 6, where it is re-absorbed. Said re-absorbed radiation is to a large extent converted to radiation of longer wavelength, which can pass filter 7 to the outer world. Reflective means 4 cause that all radiation (primary and secondary) is eventually reflected back to the phosphor layer 6 and filter 7, so that radiation losses due to absorption in the house are minimal.

Figure 2:
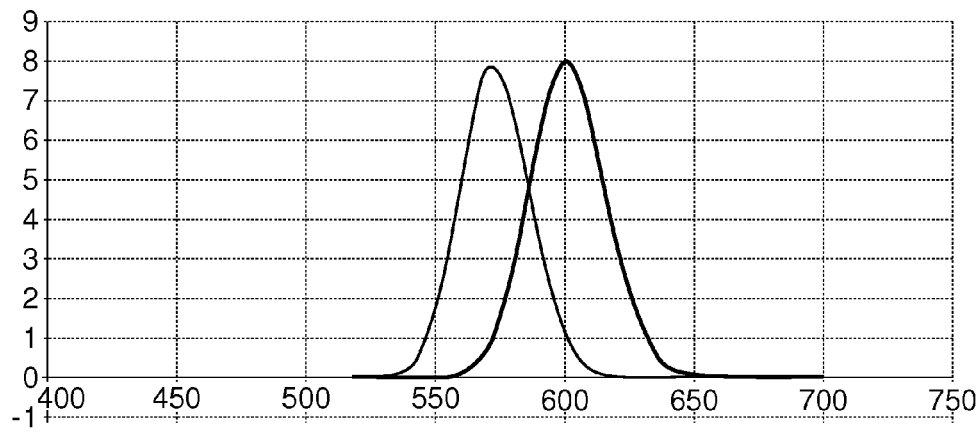
FIG. 2 shows part of the absorption spectrum and emission spectrum of phosphor (Stokes shift 0.1 eV, FWHM 28 nm) used in the illumination systems according to FIG. 1.
Figure 3:
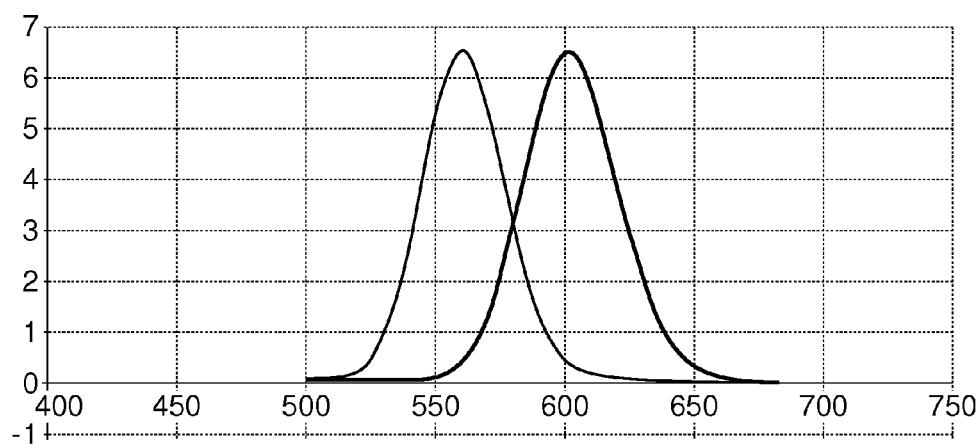
FIG. 3 shows part of the absorption spectrum and emission spectrum of another phosphor (Stokes shift 0.15 eV, FWHM 41 nm) used in the illumination systems according to FIG. 1.
Figure 4:
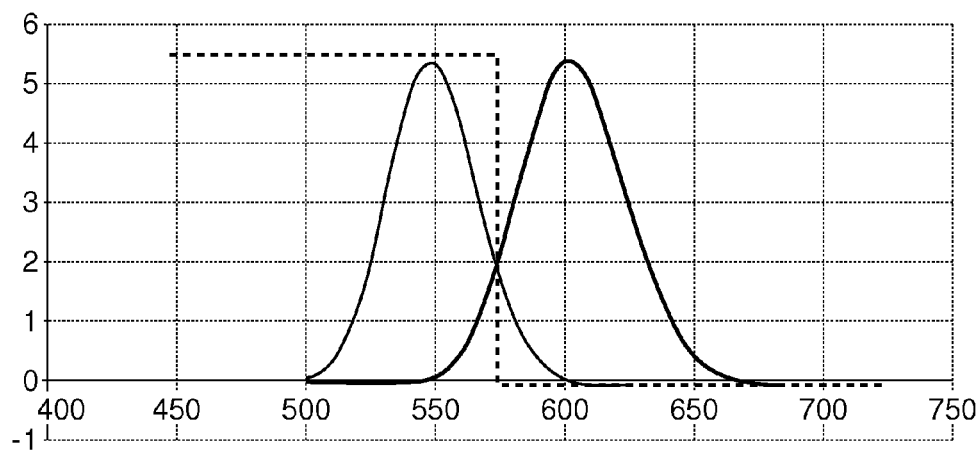
FIG. 4 shows part of the absorption spectrum and emission spectrum of an even further phosphor (Stokes shift 0.2 eV, FWHM 53 nm) used in the illumination systems according to FIG. 1.

A number of measurements and calculations have been performed based on the above described embodiment of the invented illumination system, in which different types of phosphor materials have been applied. These types of phosphors are based on the phosphor classes MgS:Eu or CaSe:Eu. Simulated spectra of three embodiments are shown in FIGS. 2-4. More specifically, FIG. 2 shows the absorption and emission spectrum of a phosphor with Stokes shift 0.1 eV and a bandwidth at half height (FWHM) of 28 nm. FIG. 3 shows the absorption and emission spectrum of another phosphor with Stokes shift 0.15 eV and FWHM of 41 nm whereas FIG. 4 shows the absorption and emission spectrum of a further phosphor with Stokes shift 0.2 eV and FWHM of 53 nm. In FIG. 4, the spectrum of the reflective filter is indicated by a dotted line. The cut-off wavelength of the filter substantially coincides with the wavelength where the absorption and the emission spectra of the radiation converting element cross (appr 570 nm).

These spectra are determined in the so-called high temperature and strong coupling limit. In this limit Gaussian line shapes are obtained for the emission bands for which the width is independent of the phonon frequencies. In practice, this is in rather good agreement with experimental findings. It is however stressed that the present invention is not limited to such phosphors. All calculated spectra have their emission maximum at 600 nm. In the simulations, the Stokes Shifts have been modified. In the mentioned limit the Stokes Shift determines the band width of the emission band and the spectral shape of the low energy side of the absorption band and for this reason the spectral overlap.

The maximum fraction of light re-absorbed in the radiation converting element can be estimated from the spectral overlap. For the three cases calculated, these estimated figures are given in table 1.

TABLE 1

| Stokes Shift (eV) | Fraction (%) |
|---|---|
| 0.1 (FIG. 2) | 20 |
| 0.15 (FIG. 3) | 12 |
| 0.2 (FIG. 4) | 7 |

From table 1, it can be concluded that a large spectral overlap is obtained for Stokes Shifts smaller than approximately 0.20 eV (approximately 53 nm in the spectral region). Application of an interference filter to reduce the bandwidth in cases where the Stokes Shift is larger does not result in a beneficial effect, as re-absorption hardly takes place under these conditions with a too small spectral overlap between the absorption and the emission bands. In this situation, the reflected light is largely lost. Inspection of these graphs shows that the interference filters should be placed such that the cut-off wavelength is equal to the wavelength where the calculated absorption- and emission spectra cross. A shift to larger or smaller wavelengths reduces the re-absorption probability considerably.

While the invention has been illustrated and described in detail in the drawings and foregoing description, such illustration and description are to be considered illustrative or exemplary and not restrictive; the invention is not limited to the disclosed embodiments. Thus wavelength converting element formed as a sintered layer 6 can be replaced by an organic resin material in which a phosphor powder has been compounded. In this situation, cavity 5 of the housing is filled with said phosphor-containing resin material. This and other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An illumination system arranged to have a narrow emission band in a certain area of the electromagnetic spectrum comprising:
    a LED light source arranged to emit primary radiation;
    a radiation converting element arranged to convert at least part of the primary radiation into secondary radiation, wherein the absorption spectrum and the emission spectrum of the radiation converting element overlap for at least 5% of the total area covered by both the normalized emission spectrum and the normalized absorption spectrum,
    wherein the spectrum overlap has a beginning wavelength and an end wavelength;
    a filter arranged to block radiation generated in the illumination system having a wavelength shorter than a certain cut-off wavelength, wherein the filter is an interference filter which reflects blocked radiation back to the radiation converting element,
    wherein the the cut-off wavelength of the filter to be less than 10 nm from one of beginning wavelength or the end wavelength.

2. An illumination system according to claim 1, wherein the Stoke Shift of the radiation converting element is smaller than 0.20 eV.

3. An illumination system according to claim 1, wherein the emission spectrum of the radiation converting element has a peak emission wavelength in the range of 585-625 nm.

4. An illumination system according to claim 1, wherein the narrow emission band in a certain area of the electromagnetic spectrum of the illumination system is in the red part of the spectrum.

5. An illumination system according to claim 4, wherein the red part of the emission spectrum of the illumination system is between 585-625 nm 6. An illumination system according to claim 4, wherein the red part of the emission spectrum of the illumination system is between 595-620 nm.

7. An illumination system according to claim 4, wherein the red part of the emission spectrum of the illumination system is between 605-615 nm.

* * * * *